United States Patent

Yu et al.

[11] Patent Number: 5,880,511
[45] Date of Patent: Mar. 9, 1999

[54] LOW-VOLTAGE PUNCH-THROUGH TRANSIENT SUPPRESSOR EMPLOYING A DUAL-BASE STRUCTURE

[75] Inventors: Bin Yu, Albany; Chenming Hu, Alamo; Ya-Chin King, Berkley; Jeffrey T. Pohlman, Camarillo; Rita Trivedi, Corpus Christi, all of Calif.

[73] Assignee: Semtech Corporation, Newbury Park, Calif.

[21] Appl. No.: 497,079

[22] Filed: Jun. 30, 1995

[51] Int. Cl.$^6$ .................................................. H01L 29/861
[52] U.S. Cl. ........................... 257/497; 257/361; 257/362
[58] Field of Search .................................. 257/497, 361, 257/362

[56] References Cited

U.S. PATENT DOCUMENTS

| | | | |
|---|---|---|---|
| 3,555,372 | 1/1971 | Hutson . | |
| 4,017,882 | 4/1977 | Kannam | 257/497 |
| 4,405,932 | 9/1983 | Ishii | 257/497 |
| 4,602,267 | 7/1986 | Shirato | 257/361 |
| 5,528,064 | 6/1996 | Thiel | 257/362 |

FOREIGN PATENT DOCUMENTS

| | | | |
|---|---|---|---|
| 0 216 380 | 1/1987 | European Pat. Off. ........ | H01L 29/06 |
| 27 45 300 | 4/1978 | Germany ........................ | H01L 29/72 |
| 58-060576 | 4/1983 | Japan .............................. | H01L 29/90 |
| 61-26267 | 2/1986 | Japan .............................. | H01L 29/90 |

*Primary Examiner*—Jerome Jackson
*Attorney, Agent, or Firm*—D'Alessandro & Ritchie

[57] ABSTRACT

A punch-through diode transient suppression device has a base region of varying doping concentration to improve leakage and clamping characteristics. The punch-through diode includes a first region comprising an n+ region, a second region comprising a p− region abutting the first region, a third region comprising a p+ region abutting the second region, and a fourth region comprising an n+ region abutting the third region. The peak dopant concentration of the n+ layers should be about $1.5E18$ cm$^{-3}$, the peak dopant concentration of the p+ layer should be between about 1 to about 5 times the peak concentration of the n+ layer, and the dopant concentration of the p− layer should be between about $0.5E14$ cm$^{-3}$ and about $1.0E17$ cm$^{-3}$. The junction depth of the fourth (n+) region should be greater than about 0.3 um. The thickness of the third (p+) region should be between about 0.3 um and about 2.0 um, and the thickness of the second (p−) region should be between about 0.5 um and about 5.0 um.

3 Claims, 10 Drawing Sheets

LOW-VOLTAGE PUNCH-THROUGH TRANSIENT SUPPRESSOR EMPLOYING A DUAL-BASE STRUCTURE

BACKGROUND OF THE INVENTION

1. Field of the Invention

The present invention relates to semiconductor devices. More particularly, the present invention relates to a low-voltage punch-through transient suppressor employing a dual base structure.

2. The Prior Art

Electronic circuitry which is designed to operate at supply voltages less than 5 volts are extremely susceptible to damage from overvoltage conditions caused by electrostatic discharge, inductively coupled spikes, or other transient conditions from its operating environment. The current trend of the reduction in circuit operating voltage dictates a corresponding reduction in the maximum voltage that the circuitry can withstand without incurring damage. As operating voltages drop below 5 volts to 3.3 volts and below it becomes necessary to clamp transient voltage excursions to below five volts.

The most widely used device currently in use for low voltage protection is the reversed biased p+n+ zener diode. See O. M. Clark, "Transient voltage suppressor types and application", *IEEE Trans Power Electron.*, vol. 5, pp. 20–26, Nov. 1990. These devices perform well at voltages of 5 volts and above but run into problems when scaled to clamp below 5 volts. The two major drawbacks incurred by using this device structure are very large leakage currents and high capacitance. These detrimental characteristics increase power consumption and restrict operating frequency.

A second device capable low clamping voltages is the n+pn+ uniform base punch through diode, such as disclosed in P. J. Kannam, "Design concepts of high energy punch-through structures" *IEEE Trans. Electron Devices*, ED-23, no. 8, pp. 879–882, 1976, and D. de Cogan, "The punch through diode", Microelectronics, vol. 8, no. 2, pp 20–23, 1977. These devices exhibit much improved leakage and capacitance characteristics over the conventional pn diode but suffer from poor clamping characteristics at high currents. If the designer tries to improve clamping to protect circuitry under industry standard surge conditions by increasing die area, the results are devices which are too large to produce economically.

It is therefore an object of the present invention to provide a low-voltage transient suppressor which avoids some of the shortcomings of the prior art.

It is another object of the present invention to provide a low-voltage transient suppressor which has a low leakage current.

It is further object of the present invention to provide a low-voltage transient suppressor which has a lower capacitance than prior-art low-voltage transient suppressors.

It is yet another object of the present invention to provide a low-voltage transient suppressor which has improved high-current clamping characteristics compared to prior-art low-voltage transient suppressors.

BRIEF DESCRIPTION OF THE INVENTION

The transient suppressor device of the present invention comprises a n+p-p+n+ punch-through diode. It is a device which can clamp at low voltages and have leakage and capacitance characteristics superior to those of prior-art transient suppressors. The punch-through diode of the present invention includes a first region comprising an n+ region, a second region comprising a p− region abutting the first region, a third region comprising a p+ region abutting the second region, and a fourth region comprising an n+ region abutting the third region.

The peak dopant concentration of the n+ layers should be about $1.5E18$ cm$^3$, the peak dopant concentration of the p+ layer should be between about 50 to about 2,000 times the peak concentration of the p− layer, and the dopant concentration of the p− layer should be between about $0.5E14$ cm$^3$ and about $1.0E17$ cm$^3$. The junction depth of the fourth (n+) region should be between about 0.3 um and about 1.5 um. The thickness of the third (p+) region should be between about 0.3 um and about 2.0 um, and the thickness of the second (p−) region should be between about 0.5 um and about 5.0 um.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
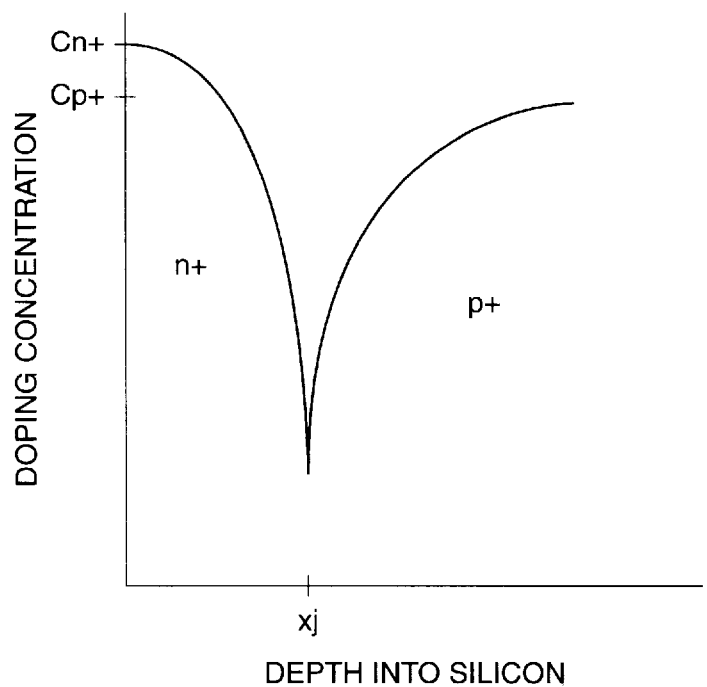
FIG. 1 is a graph showing the doping profile of a prior-art pn zener diode.

Reversed biased p+n+ zener diodes are currently the most widely-used devices for low voltage protection. These devices perform satisfactorily at voltages of 5 volts and above but exhibit very large leakage currents and high capacitance, two major drawbacks, when designed to clamp below 5 volts. FIG. 1. depicts the impurity doping profile of a typical low voltage pn junction device.

Figure 2:
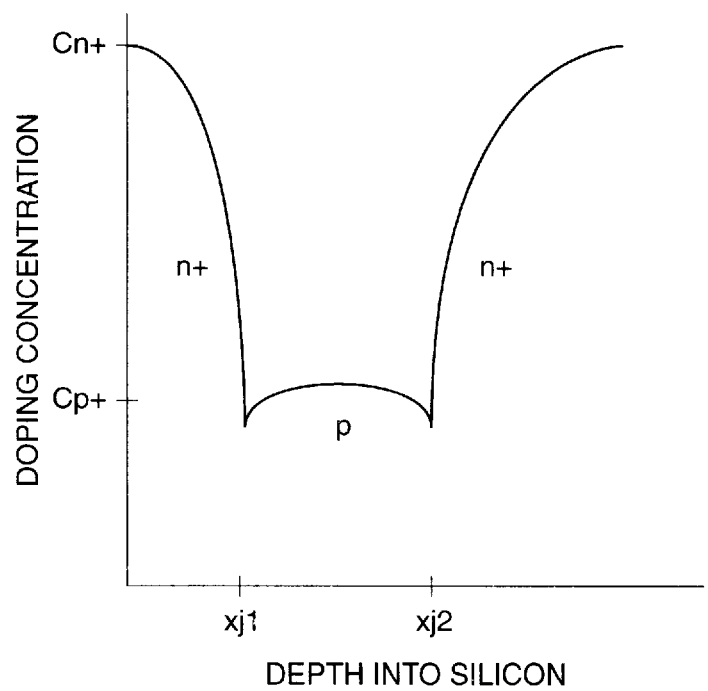
FIG. 2 is a graph showing the doping profile of a prior-art n+pn+ punch-through diode.

The n+pn+ uniform base punch-through diode is a second device capable of clamping low voltages. While the leakage and capacitance characteristics of the punch-through diode are superior to the conventional pn diode, the punch-through diode has poor clamping characteristics at high currents. The doping profile of a low voltage n+pn+ uniform base punch-through diode is shown in FIG. 2.

Figure 3:
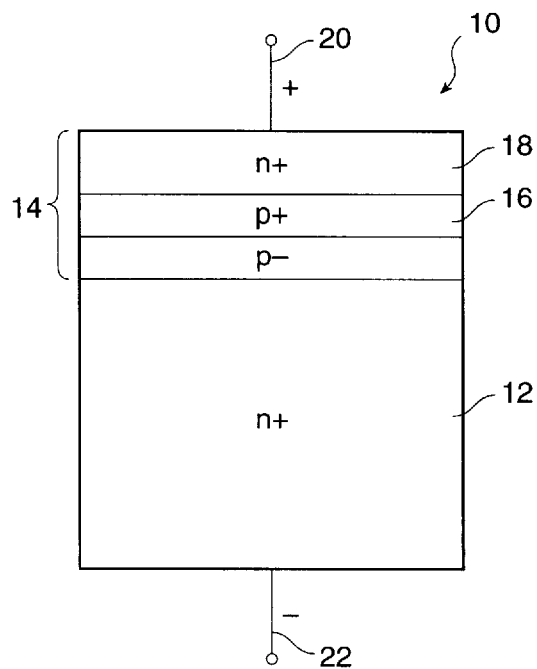
FIG. 3 is a schematic representation of a cross-sectional view of the punch-through n+p-p+n+ punch-through diode of the present invention.

Referring now to FIG. 3, a n+p-p+n+ punch-through diode 10 according to the present invention is shown schematically in cross sectional view. The n+p-p+n+ punch-through diode of the present invention is formed on an n+ region 12 which may comprise a semiconductor substrate. An epitaxially grown p– region 14 is formed over the upper surface of n+ region 12. P+ region 16 is formed by further p-type doping of the upper surface of the epitaxial layer 14. An n+ region 18 is formed over p+ region 16 by n-type doping of the upper surface of the epitaxial layer. Electrodes 20 and 22 are in contact with n+ region 12 and n+ region 18, respectively to make electrical contact to the n+p-p+n+ punch-through diode device 10. Those of ordinary skill in the art will appreciate that after the n-type doping step which creates n+ region 18, only a small region 24 of original epitaxial layer 14 remains doped at a p– level.

Table I gives the presently preferred minimum and maximum doping levels of the regions of the layers 12, 14, 16, and 18. The doping levels for the n+ layers 12 and 18 and p+ layer 16 are expressed in peak dopant concentration values (Cn+ and Cp+) and the doping level for the p– layer 14 is expressed as an average value (Cp–).

TABLE I

| Layer | Minimum | Maximum |
|---|---|---|
| Cn+ (Peak concentration of n layers) | 1.5E18 cm–3 | not critical |
| Cp+ (Peak concentration of p+ layer) | 5.0E1 × Cp– | 1.0E3 × Cp– |
| Cp– (concentration of the p– layer) | 0.5E14 cm–3 | 1.0E17 cm–3 |

Table II gives the range of thicknesses (expressed in um) for the junction depth of n+ region 18, p– region 16, and p+ region 18. In Table II, the quantities xj1, xj2, and xj3 refer to linear positions along the thickness of the epitaxial layer after performance of the implant doping steps.

TABLE II

| Layer | Minimum | Maximum |
|---|---|---|
| xj1 (n+ junction depth) | 0.3 um | not critical |
| xj2–xj1 (p+ layer thickness) | 0.3 um | 2.0 um |
| xj3–xj2 (p layer thickness) | 0.5 um | 5.0 um |

The electrical characteristics of the n+p-p+n+ punch-through diode of the present invention are determined by the peak concentrations and widths of each of the layers depicted in FIG. 3. It is possible to build suitable devices using a fairly wide range of junction widths and concentrations. It is necessary to optimize the structure to fit the fabrication process.

Figure 4:
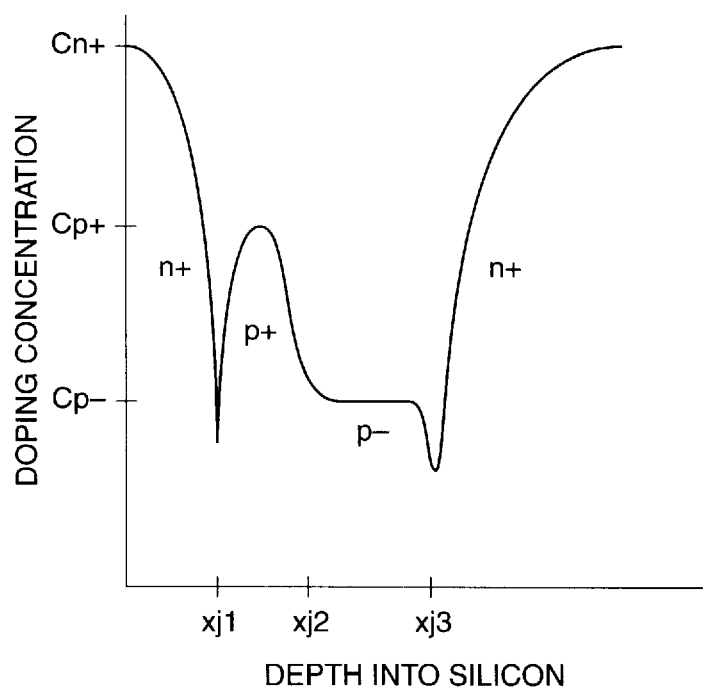
FIG. 4 is a graph showing the doping profile of an n+p-p+n+ punch through diode of the present invention such as that of FIG. 3.

By constructing a punch-through diode according to the present invention having a p– region that has an optimized doping profile a device can be manufactured which has superior performance to prior art. Such an optimized doping profile for such a structure is depicted in FIG. 4. FIG. 4 illustrates the relative positions of xj1, xj2, and xj3. Persons of ordinary skill in the art will appreciate that the doping profile of the device of the present invention is significantly different from the doping profiles of the prior-art devices depicted in FIGS. 1 and 2.

Figure 5:
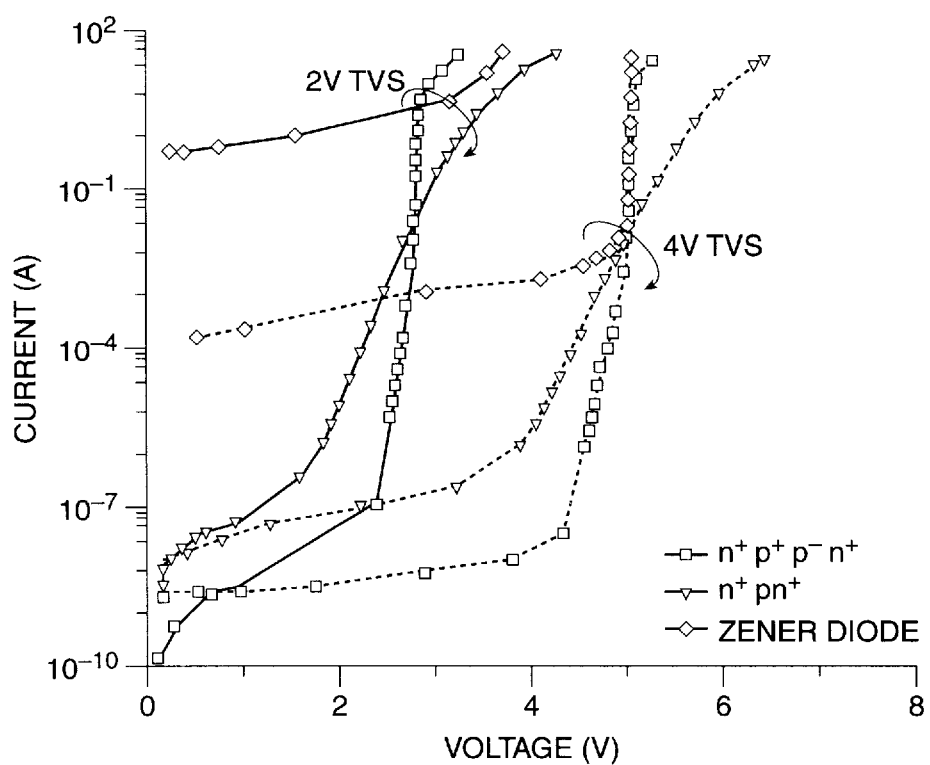
FIG. 5 is a graph comparing the current vs voltage characteristics comparison of the n+p+pn+ diode of the present invention against the prior art.

FIG. 5 shows the current vs voltage characteristics of devices with an active area of 7.86 $mm^2$ constructed using the prior art structures and using the new n+p-p+n+ punch-through structure of the present invention. The most desirable characteristics are to have low current levels at the specified operating voltage and a near vertical I/V characteristic at high currents. FIG. 5 includes two sets of curves for each device type. One is for a devices which have a 2 volt working voltage and one is for devices having a nominal 4 volt working voltage.

It can be seen from FIG. 5 that at the working voltage of the device the new n+p-p+n+ structure of the present invention has leakage values which are four orders of magnitude lower than those achieved with conventional pn structures and one order of magnitude lower than that of the prior-art punch-through devices. Importantly, this is achieved without sacrificing the high-current performance of the device of the present invention. The current clamping characteristics of the punch-through device of the present invention match that of the conventional pn structure up to current densities of over 500A/$cm^2$. It can also be seen that the leakage levels for zener type devices constructed to protect below 4 volts are unacceptably high as indicated by its nearly horizontal I/V characteristic.

Figure 6:
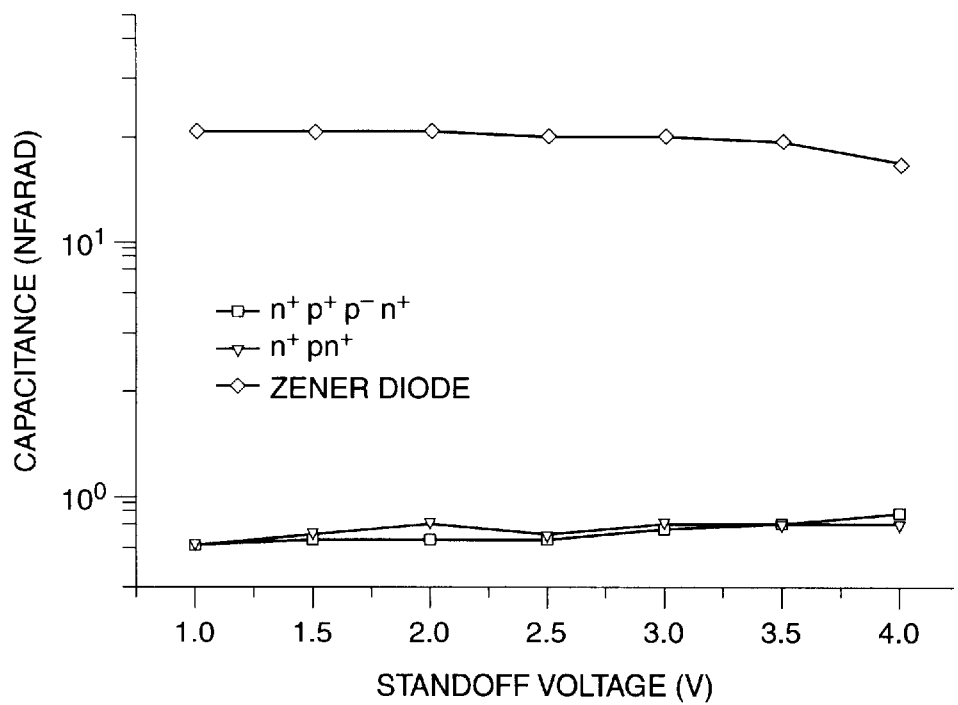
FIG. 6 is a graph comparing the capacitance vs voltage characteristics of the n+p+pn+ diode of the present invention against the prior art.

FIG. 6 shows the capacitance for each of the device structures over the operating voltage range for each device. It can be seen from an examination of FIG. 6 that both the prior-art punch-through device and the new n+p-p+n+ structure of the present invention have capacitance values over one order of magnitude lower than that of the pn diode. This characteristic of the device of the present invention will allow for transient suppression protection of higher frequency lines.

Figure 7:
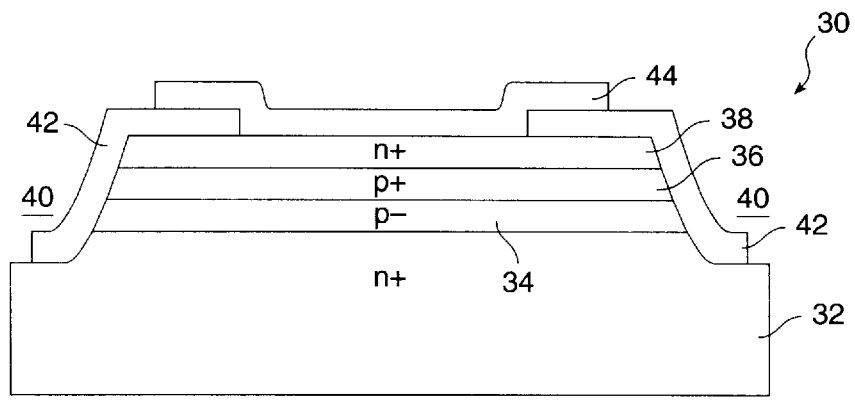
FIG. 7 is a cross-sectional view of a trench/mesa isolated n+p-p+n+ transient suppressor diode according to one presently preferred embodiment of the invention.
Figure 9:
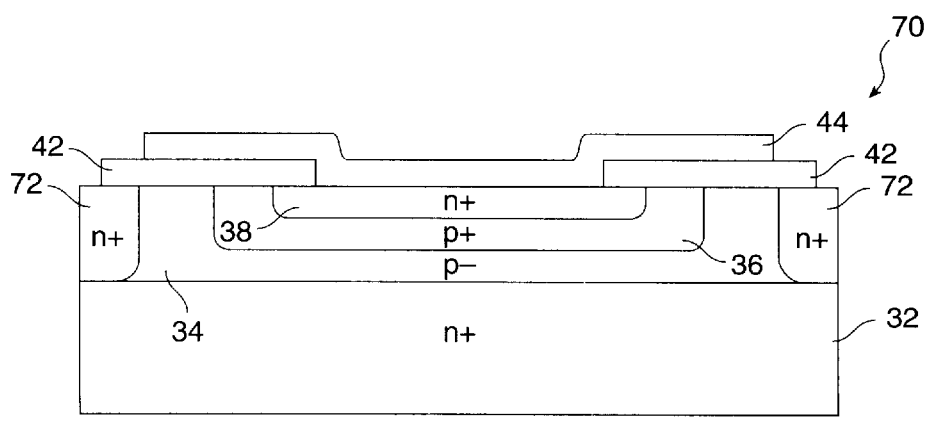
FIG. 9 is a cross-sectional view of a diffusion isolated n+p+pn+ diode according to another presently preferred embodiment of the invention.

The n+p-p+n+ punch-through transient suppressor diode of the present invention can take several forms. Two illustrative forms of the device of the present invention are shown in FIGS. 7 and 9. Referring first to FIG. 7, a n+p-p+n+ punch-through transient suppressor diode fabricated according to the principles of the present invention using trench isolation techniques is shown in cross-sectional view.

The trench/mesa isolation n+p-p+n+ punch-through transient suppressor diode 30 is shown fabricated on n+ substrate 32. N+ substrate 32 is n-type silicon having a maximum 0.01 ohm/cm resistivity. P– layer 34 is disposed on the upper surface of the n+ substrate 32. P+ layer 36 is disposed on the upper surface of p– layer 34. Finally, n+ layer 38 is disposed on the upper surface of p+ layer 36. Trenches 40 are disposed at the periphery of layers 34, 36, and 38 and extend down into substrate 32. A passivation layer 42 is disposed over the upper surface of n+ layer 38 and extends into trenches 40 down to substrate 32 to cover the edges of layers 34, 36, and 38. Metal contact 44 is disposed in an aperture formed in passivation layer 42 and makes electrical contact with n+ layer 38.

The n+p-p+n+ punch-through diode of the present invention can be manufactured using standard silicon wafer fabrication techniques. A typical process flow with ranges that could accommodate most processing equipment for a mesa or trench isolated device such as that depicted in FIG. 7 is shown below with reference to FIGS. 8a–8g. Those of ordinary skill in the art will readily appreciate that the process flow disclosed herein is in no way meant to be restrictive as there are numerous ways to create the required structures and doping profile for the n+p-p+n+ punch-through transient suppressor diode.

Figure 8A:
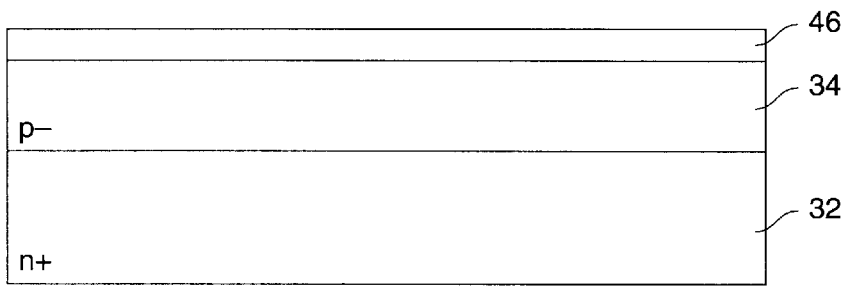
FIGS. 8a–8g are cross sectional views of the trench/mesa isolated n+p-p+n+ transient suppressor diode of FIG. 7 taken after completion of selected steps in an illustrative fabrication process.

Referring first to FIG. 8a, the starting substrate material 32 for the n+p-p+n+ punch-through transient suppressor diode depicted in FIG. 7 is n-type Si having a maximum resistivity of 0.01 ohm/cm. A p-type epitaxial layer 34 having a resistivity in the range of from about 2 to about 50 ohm/cm is grown to a thickness of between about 2 to about 9 um using conventional epitaxial growth techniques.

Next, an oxide layer 46 comprising $SiO_2$ having a thickness from between about 200 angstroms to about 500 angstroms thick is grown using, for example, standard thermal oxidation techniques. FIG. 8a shows the structure resulting after the performance of these steps.

Figure 8B:
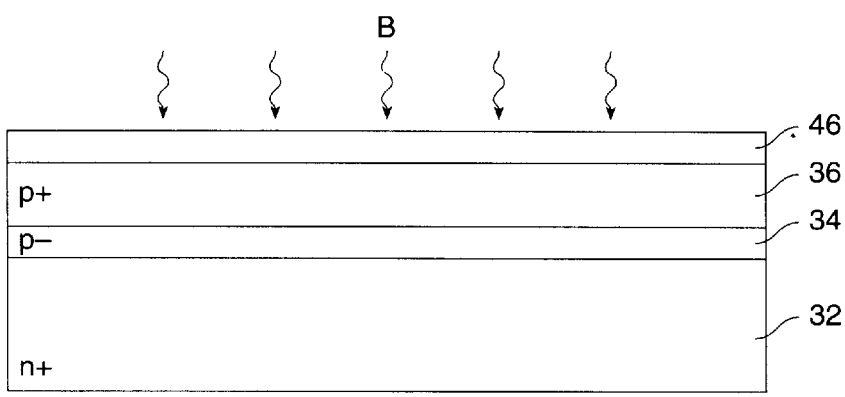

Referring now to FIG. 8b, a boron implant is performed to form p+ region 36. The level of the boron dopant may be in the range of from about $5E12\ cm^{-2}$ to $3E15\ cm^{-2}$ at an energy of between about 40 KEV and about 200 KEV. An anneal and drive-in step is then performed for from about 30 minutes to about 2 hours at a temperature in the range of from about 900° C. to about 1,100° C. FIG. 8b shows the structure resulting after the performance of the boron implant and anneal steps. As can be seen from an examination of FIG. 8b, p– region 34 has decreased in thickness as the heavier p doping from the surface of the epi layer creates p+ region 36.

Figure 8C:
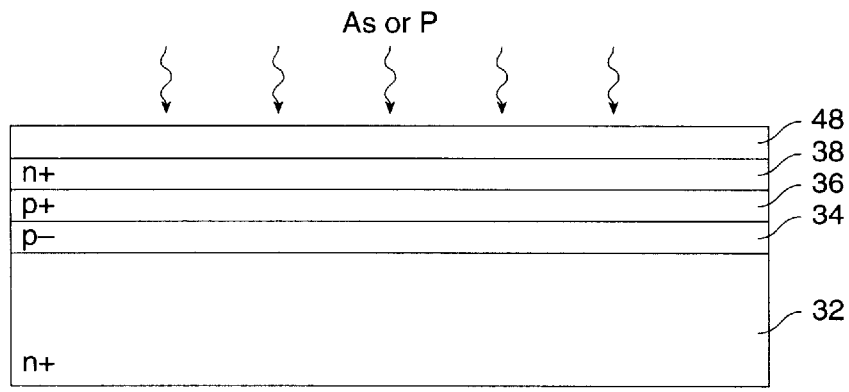

Referring now to FIG. 8c, oxide layer 46 is removed using conventional oxide etching technology. Another oxide layer 48 is applied using, for example, standard thermal oxidation techniques, and an n-type implant is performed through oxide 48 with a dopant species such as phosphorous or arsenic at a dose of between about $1E15\ cm^{-2}$ to $5E15\ cm^{-2}$ at an energy of between about 40 KEV and about 120 KEV to form n+ region 38. The implant step is followed by an n+ diffusion step performed for from about 15 minutes to about 60 minutes at a temperature in the range of from about 850° C. to about 1000° C. to drive in the n+ implant. FIG. 8c shows the structure resulting after the performance of the arsenic implant and drive-in steps but prior to removal of oxide layer 48. As may be seen from FIG. 8c, the upper portion of the epi layer has been converted to an n+ region by the n-type implant.

Figure 8D:
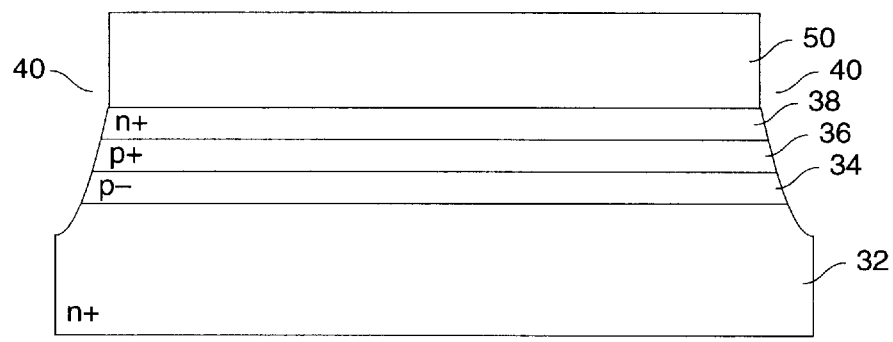

Referring now to FIG. 8d, oxide layer 48 is removed using conventional oxide etching techniques and a trench photomask 50 is applied to the upper surface of n+ region 38 using standard photolithography techniques. The trenches 40 are then formed using an etching step such as standard chemical or RIE etching techniques to a depth into the substrate sufficient to provide isolation, i.e., 0.5 um. FIG. 8d shows the structure resulting after the performance of the trench masking and etching steps but prior to removal of trench photomask 50.

Figure 8E:
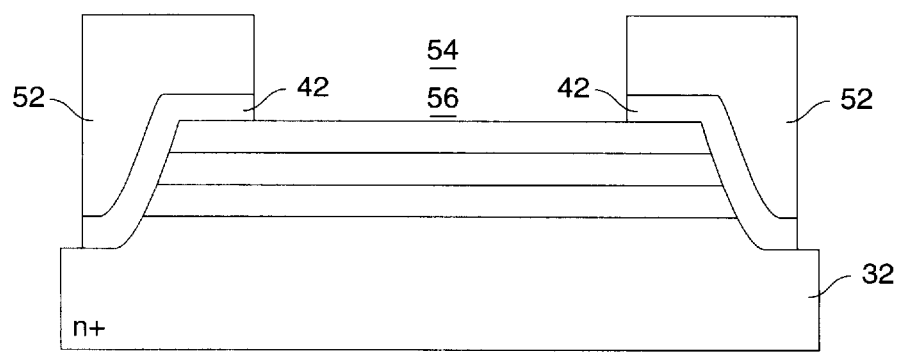

Referring now to FIG. 8e, photomask 50 is removed and a passivation layer 42 comprising a material such as an LPCVD oxide or an equivalent deposition step at a temperature below 800° C. is formed over the upper surface of n+ region 38 and into trenches 40. Contact photomask 52 having contact aperture 54 is then applied to the surface of passivation layer 42. A contact opening 56 is next formed in passivation layer 42 using a conventional etching step to clear the surface of n+ region 38. FIG. 8e shows the structure resulting after the performance of the contact masking and etching steps but prior to removal of contact photomask 52.

Figure 8F:
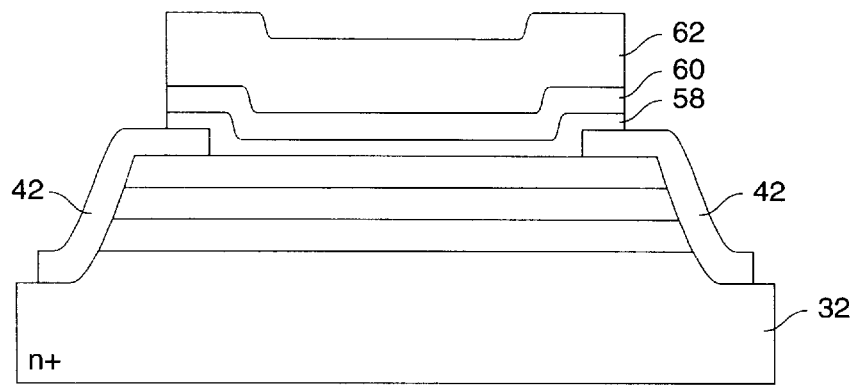

Referring now to FIG. 8f, contact photomask 52 is removed and a barrier metal layer 58 is formed over the surface of passivation layer 42 and into contact opening 54 to make electrical contact with n+ region 38. Barrier layer 58 may comprise a material such as titanium or titanium tungsten having a thickness in the range of about 500–1,000 angstroms. A metal layer 60 comprising a material such as aluminum having a thickness in the range of 20,000 angstroms is formed over barrier layer 58. Together, barrier metal layer 58 and metal layer 60 form metal contact 44 of the device of FIG. 7.

Next, a metal mask 62 is formed over the surface of metal layer 60 using conventional photolithography techniques. The metal layer and barrier layer are then defined using conventional etching technology. FIG. 8f shows the structure resulting after the formation and definition of the barrier metal layer and metal layer but prior to removal of metal mask 62.

Figure 8G:
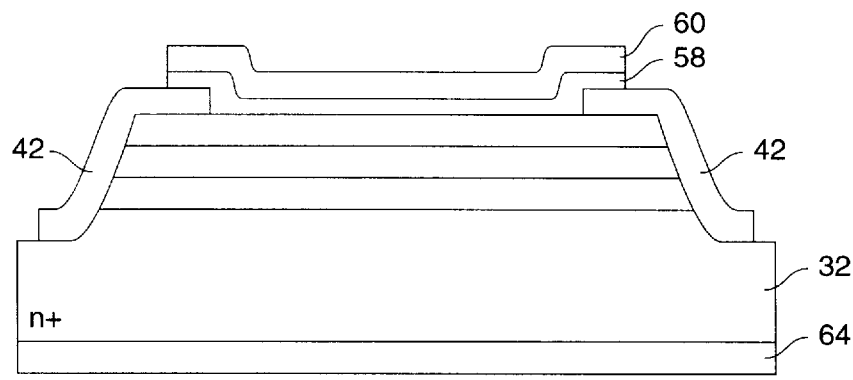

Referring now to FIG. 8g, metal mask 62 is removed and a backgrind step is performed on the substrate to grind it to about 0.012" nominal thickness. A backmetalization step is employed to form a metal layer 64 for use as a contact on the substrate. Any low ohmic process consistent with the assembly technique to be employed may be used. FIG. 8g shows the completed structure resulting after the backgrinding and backmetalization steps.

An alternative structure also suitable for manufacture of the device of the present invention is shown in FIG. 9. This embodiment could be manufactured by adding an n+ isolation mask and diffusion before the boron implant step and eliminating the trench mask/etch step. In the following drawing figures illustrating this embodiment, where structures are the same as corresponding structures in the embodiment of FIG. 7, they will be assigned the same reference numerals.

Referring now to FIG. 9, n+p-p+n+ punch-through transient suppressor diode 70 is fabricated on n+ substrate 32. As in the embodiment of FIG. 7, n+ substrate 32 is n-type silicon having a maximum 0.01 ohm/cm resistivity. P– layer 34 is disposed in a defined region on the upper surface of the n+ substrate 32. P+ layer 36 is disposed in a defined region on the upper surface of p– layer 34. Finally, n+ layer 38 is disposed in a defined region on the upper surface of p+ layer 36. In the place of trenches 40, the embodiment of FIG. 9 includes isolation diffusions 72 disposed at the periphery of region 34 which extend down into and merge with n+ substrate 32. A passivation layer 42 is disposed over the upper surface of n+ layer 38 and extends over isolation diffusions 72. Metal contact 44 is disposed in an aperture formed in passivation layer 42 and makes electrical contact with n+ layer 38.

The embodiment of the device depicted in FIG. 9 may be fabricated using a process similar to the process described with reference to FIGS. 8a–8g. The major difference between the device structure of FIG. 7 and that of FIG. 9 is that the use of trench isolation allows blanket implant processing, whereas the device structure of FIG. 9 requires masked implants to form the regions 34, 36, and 38.

Figure 10A:
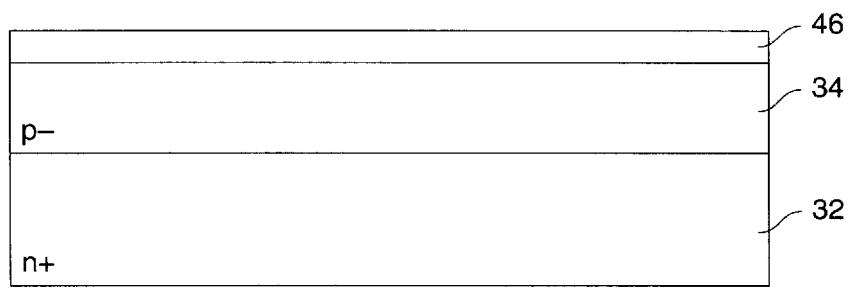
FIGS. 10a–10h are cross sectional views of the diffusion isolated n+p-p+n+ transient suppressor diode of FIG. 9 taken after completion of selected steps in an illustrative fabrication process.

Referring now to FIGS. 10a–10h, an illustrative fabrication process for the n+p-p+n+ punch-through transient suppressor diode 70 of FIG. 9 is illustrated. Referring first to FIG. 10a, the starting substrate material 32 for the n+p-p+n+ punch-through transient suppressor diode depicted in FIG. 9 is n-type Si having a maximum resistivity of 0.01 ohm/cm. A p-type epitaxial layer 34 having a resistivity in the range of from about 2 to about 50 ohm/cm is grown to a thickness of between about 2 to about 9 um using conventional epitaxial growth techniques. FIG. 10a shows the structure resulting after the epitaxial growth step. Those of ordinary skill in the art will recognize that, up to this point the processes used to make the embodiments of FIGS. 7 and 9 are the same.

Figure 10B:
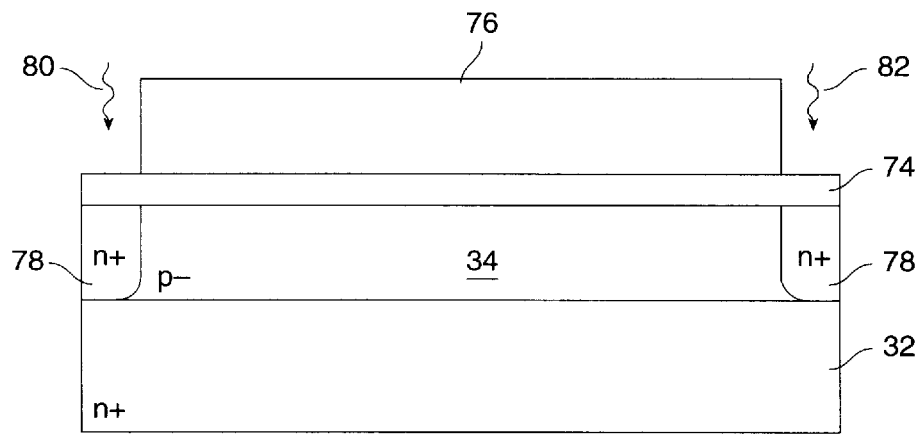

Referring now to FIG. 10b, an oxide layer 74 and an isolation implant mask 76 are next applied to the surface of the epitaxial layer 34 and n+ isolation implants 78 are formed through apertures 80 and 82 in isolation implant mask 76 using phosphorous to a concentration of about 1E15 to about 5E15 at an energy of between about 40 KEV and about 80 KEV. The implants are then driven in for between about 30 and about 120 minutes at a temperature of between about 1,100° and about 1,200° C. FIG. 10b shows the structure resulting after the formation of isolation implants 78 but prior to removal of isolation implant mask 76 and oxide layer 74.

Figure 10C:
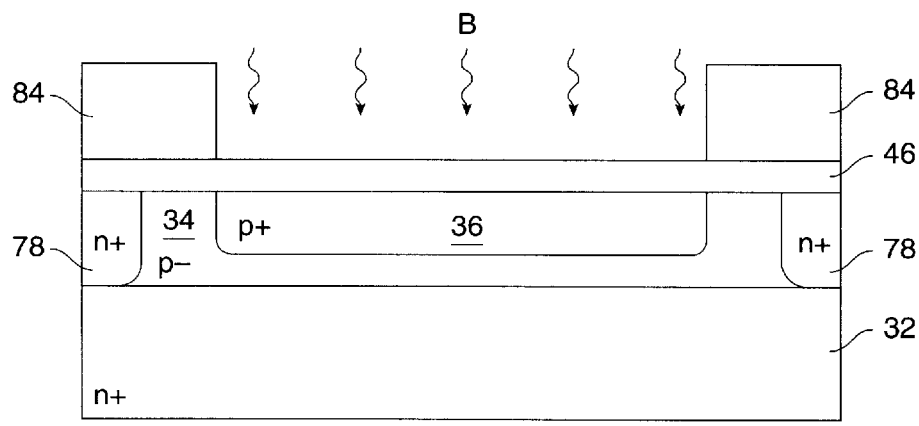

Referring now to FIG. 10c, an oxide layer 46 comprising $SiO_2$ having a thickness from between about 200 angstroms to about 500 angstroms thick is grown using, for example, standard thermal oxidation techniques. A p+ implant mask 84 is applied to the surface of oxide layer 46 and a boron implant is performed through aperture 86 in p+ implant mask 84 to form p+ region 36. As in the embodiment of FIG. 7, the level of the boron dopant may be in the range of from about 5E12 $cm^{-2}$ to 3E15 $cm^{-2}$ at an energy of between about 40 KEV and about 200 KEV. An anneal and driven step is then performed for from about 30 minutes to about 2 hours at a temperature in the range of from about 900° C. to about 1,100° C. FIG. 10c shows the structure resulting after the performance of the boron implant and anneal steps but prior to removal of the p+ implant mask 84 and oxide layer 46.

Figure 10D:
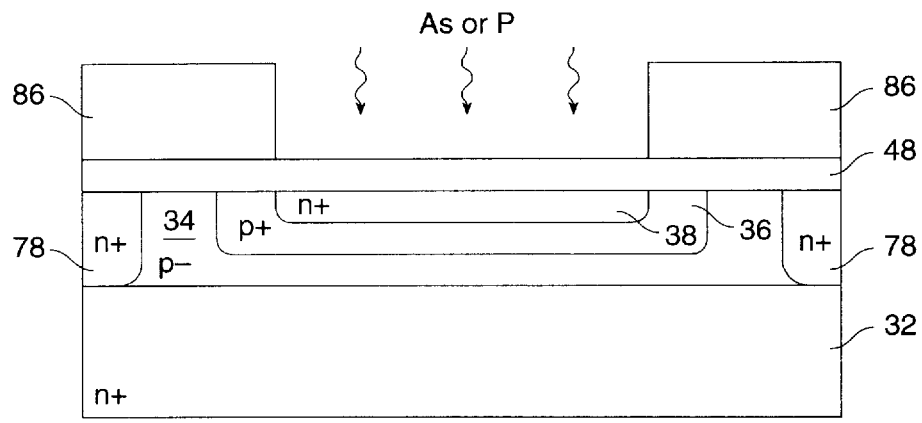

Referring now to FIG. 10d, p+ implant mask 84 and oxide layer 46 are removed using conventional oxide etching technology. Another oxide layer 48 is applied using, for example, standard thermal oxidation techniques, and an n+ implant mask 86 is applied to the surface of oxide layer 48 using conventional photolithography techniques. An n-type implant is performed through and aperture 88 in n+ implant mask 86 and oxide 48 with phosphorous as a dopant species at a dose of between about 1E15 $cm^{-2}$ to 5E15 $cm^{-2}$ at an energy of between about 40 KEV and about 120 KEV to form n+ region 38. The implant step is followed by an n+ diffusion step performed for from about 15 minutes to about 60 minutes at a temperature in the range of from about 850° C. to about 1000° C. to drive in the n+ implant. FIG. 10d shows the structure resulting after the performance of the phosphorous implant and drive-in steps but prior to removal of n+ implant mask 86 and oxide layer 48.

Figure 10E:
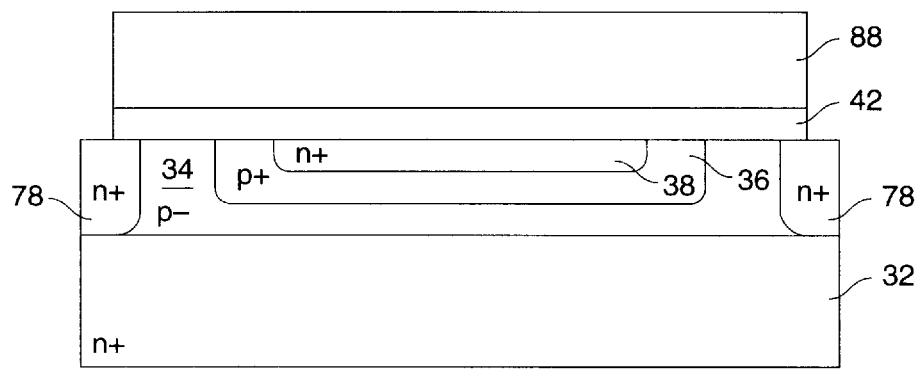

Referring now to FIG. 10e, photomask 86 and oxide layer 48 are removed and a passivation layer 42 comprising a material such as an LPCVD oxide or an equivalent deposition step at a temperature below 800° C. is formed over the upper surface of n+ region 38. Passivation mask 88 is then applied to the surface of the passivation layer 42 to define it and a conventional oxide etching step is employed to define the passivation layer. FIG. 10e shows the structure resulting after the performance passivation layer definition etch but prior to removal of passivation mask 88.

Figure 10F:
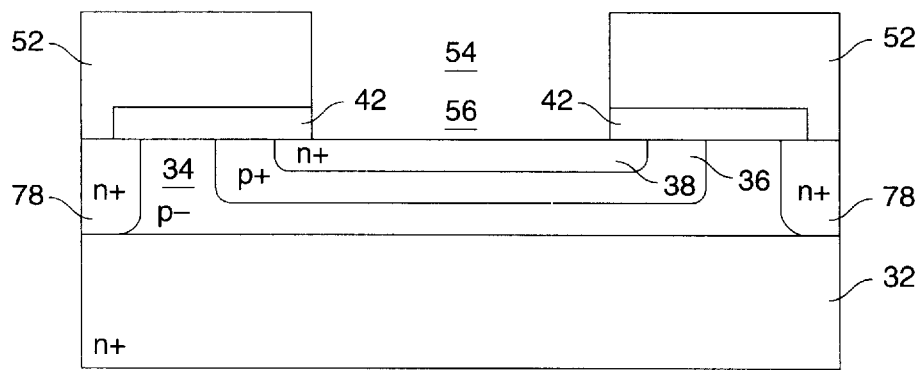

Referring now to FIG. 10f, passivation mask 88 is removed and contact photomask 52 having contact aperture 54 is then applied to the surface of passivation layer 42. A contact opening 56 is next formed in passivation layer 42 using a conventional etching step to clear the surface of n+ region 38. FIG. 10f shows the structure resulting after the performance of the contact masking and etching steps but prior to removal of contact photomask 52. Those of ordinary skill in the art will recognize that passivation mask 88 and contact mask 56 could be the same mask and these steps would then be consolidated.

Figure 10G:
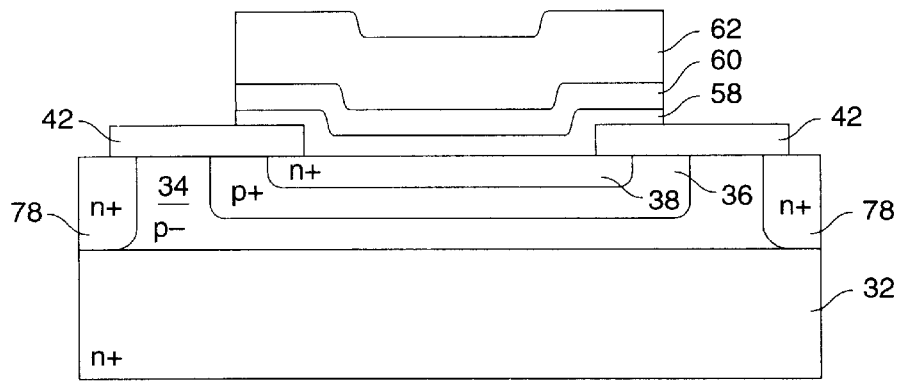

Referring now to FIG. 10g, contact photomask 52 is removed and a barrier metal layer 58 is formed over the surface of passivation layer 42 and into contact opening 54 to make electrical contact with n+ region 38. Barrier layer 58 may comprise a material such as titanium or titanium tungsten having a thickness in the range of about 500 to about 1,000 angstroms A metal layer 60 comprising a material such as aluminum having a thickness in the range of 20,000 angstroms is formed over barrier layer 58. Together, barrier metal layer 58 and metal layer 60 form metal contact 44 of the device of FIG. 7.

Next, a metal mask 62 is formed over the surface of metal layer 60 using conventional photolithography techniques. The metal layer and barrier layer are then defined using conventional etching technology. FIG. 10g shows the structure resulting after the formation and definition of the barrier metal layer and metal layer but prior to removal of metal mask 62.

Figure 10H:
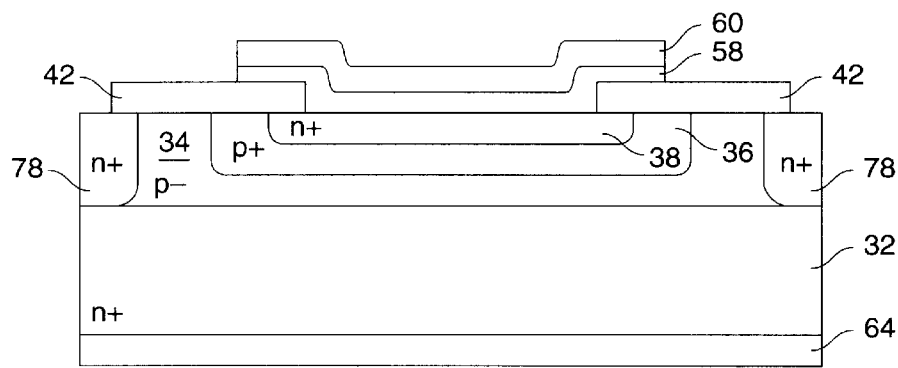

Referring now to FIG. 10h, metal mask 62 is removed and a backgrind step is performed on the substrate to grind it to about 0.012" nominal thickness. A backmetalization step is employed to form a metal layer 64 for use as a contact on the backside of the substrate. Any low ohmic process consistent with the assembly technique to be employed may be used. FIG. 10h shows the completed structure resulting after the backgrinding and backmetalization steps.

The following data in Table III is an example of the processing parameters used to fabricate an actual n+p-p+n+ punch-through diode transient suppressor device according to the present invention, and the resulting physical parameters (Table IV) and electrical parameters (Table V) exhibited by the device.

TABLE III

| Process parameters | | |
|---|---|---|
| Boron implant (p+) | 5E14 cm−2 | 90 keV |
| Boron drive | 70 min. | 1040° C |
| Phos Implant | 1E 15 | 80 keV |
| n+ drive | 15 min | 900° C. |

TABLE IV

| Physical Measurements | |
|---|---|
| xj1 | 0.6 um |
| xJ2 | 1.2 um |
| xj3 | 1.9 um |
| Cn+ | 2.0E19 $cm^3$ |
| Cp+ | 1.0E 17 $cm^3$ |
| Cp | 1.8E15 $cm^3$ |

TABLE V

| Electrical Characteristics | |
| --- | --- |
| BV at 0.1 A/cm$^2$ | 3.9 V to 4.0 V |
| Ir at 80% of BV (standoff voltage) | 3E-3 A/cm$^2$ |
| Vclamp at 1,500 A/cm$^2$ | 4.3 V |
| Capacitance at 0 V | 400–450 pF |

Figure 11:
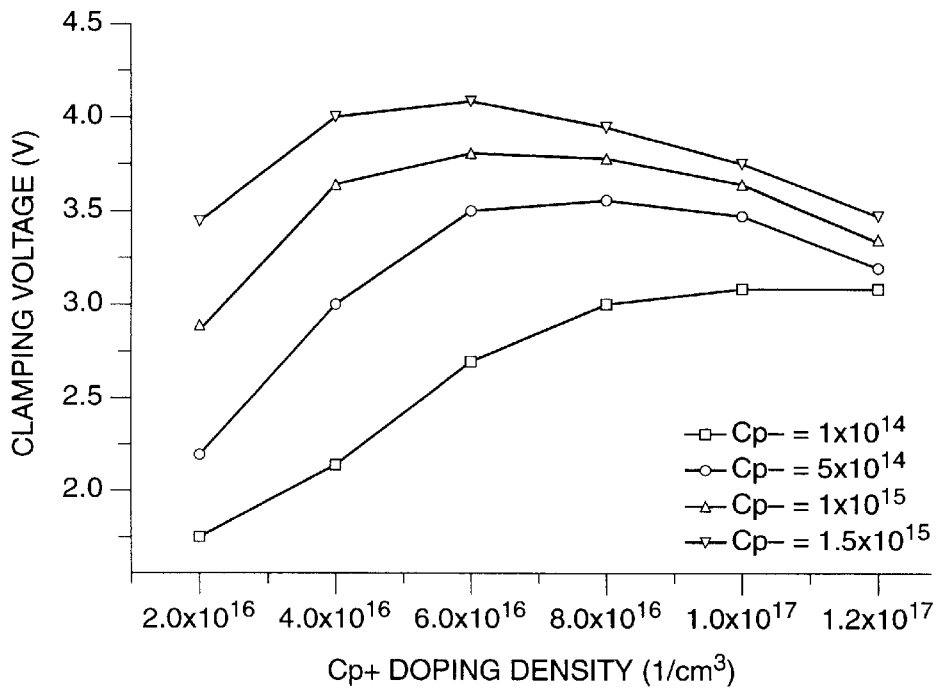
FIG. 11 is a graph of clamping voltage vs. p+ doping density for a n+p-p+n+ transient suppressor diode according to the present invention.
Figure 12:
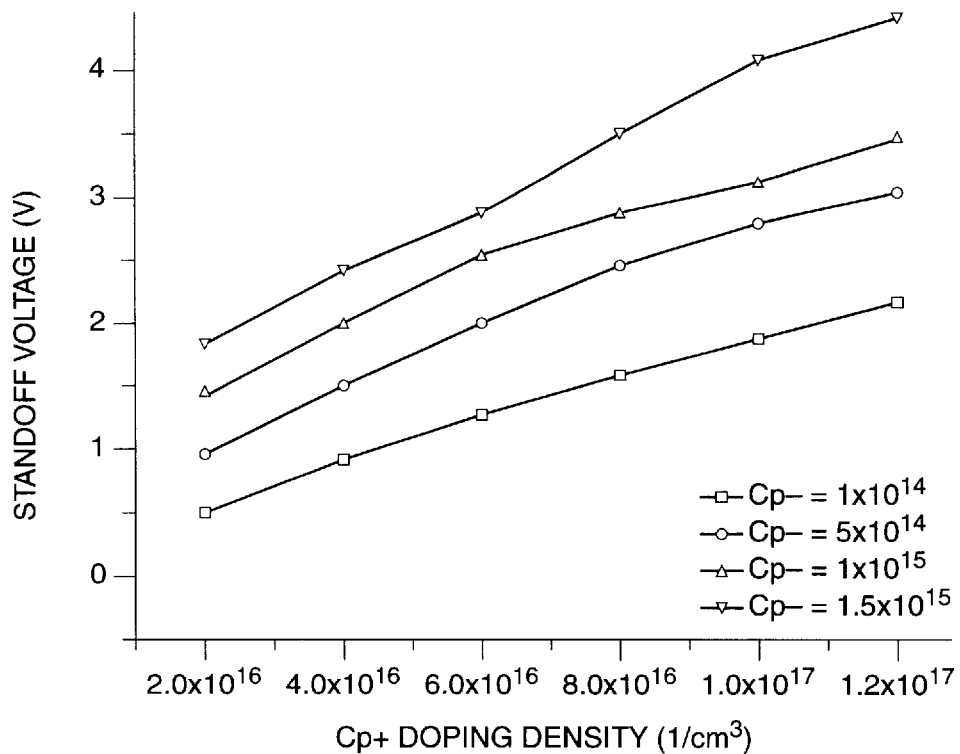
FIG. 12 is a graph of standoff voltage vs. p+ doping density for a n+ p-p+n+ transient suppressor diode according to the present invention.
Figure 13:
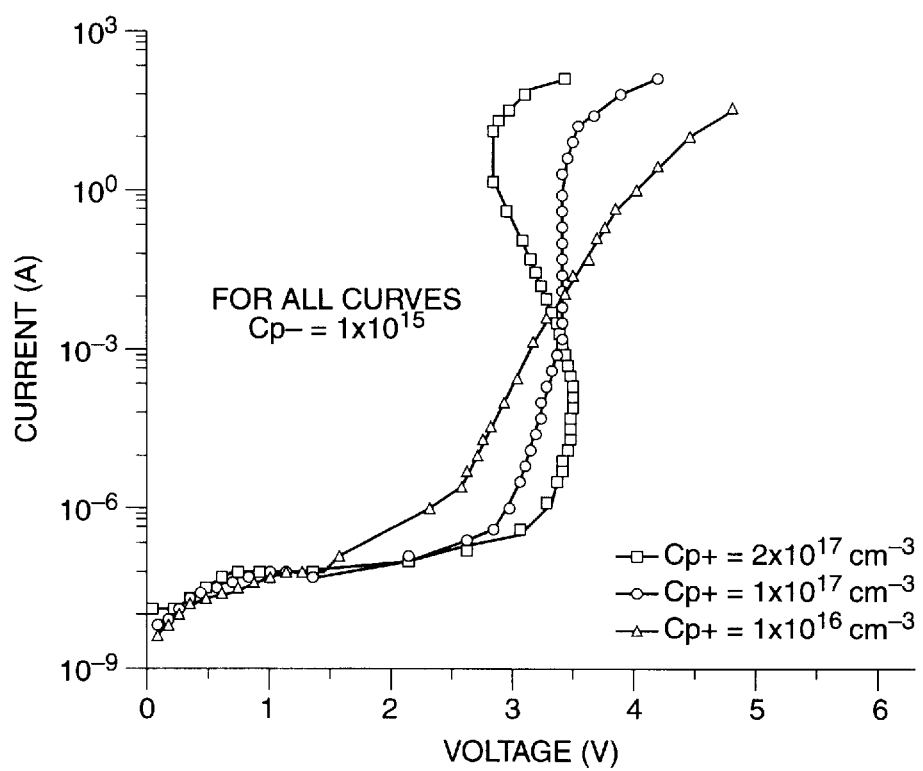
FIG. 13 is a graph of current vs. voltage for a n+ p-p+n+ transient suppressor diode according to the present invention.

The characteristics shown in Tables III, IV, and V may be extrapolated to other processing conditions. FIGS. 11, 12, and 13 are graphs which illustrate the variations of device characteristics as a function of processing parameters. The data in these charts have not been fully verified by experiment. Verification tests are still being run as of the filing date of this application.

FIG. 11 is a set of curves of device clamping voltage vs. p+ doping density for a n+p-p+n+ transient suppressor diode according to the present invention. The four curves represent boron doping densities of the p+ region of 1E14, 5E14, 1E15, and 1.5E15, expressed in cm$^3$ units.

FIG. 12 is a set of curves of standoff voltage vs. p+ doping density for a n+ p-p+n+ transient suppressor diode according to the present invention. Standoff voltage is equal to 80% of BV. The four curves represent boron doping densities of the p+ region of 1E14, 5E14, 1E15, and 1.5E15, expressed in cm$^3$ units.

FIG. 13 is a graph of current vs. voltage and illustrates the advantages of the n+p-p+n+ transient suppressor diode of the present invention. FIG. 13 shows the effects of the differential in doping of the p- and p+ regions according to the present invention. The three curves represent p+ boron doping densities of the p+ region of 1E16, 5E17, and 2E17 expressed in cm$^3$ units. In each case, the p- boron doping density of the p- region is 1E15. The curve representing a p+ doping density of 1E16, only 10 times that of the p- region shows behavior approaching that of prior-art punch-through devices. From FIG. 13, it is clear that a ratio of 100 gives the optimum characteristic and that varying this ratio can have dramatic effects on the clamping characteristics. At present, it is thought that the ratio plays an important role in achieving the desired characteristics, but the desired results may be due in part to other restrictions, such as layer thicknesses.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A punch-through diode transient suppression device comprising:

a n+ substrate;

a p- region disposed on an upper surface of said n+ substrate;

a p+ region disposed on an upper surface of said p- region;

an n+ region disposed on an upper surface of said p+ region;

an isolation trench disposed at outer edges of said p- region, said p+ region, and said n+ region, said isolation trench extending into said n+ substrate;

a passivation layer disposed over an upper surface of said n+ region and extending into said isolation trench and in contact with said n+ substrate; said passivation layer including a contact aperture therethrough to an upper surface of said n+ region;

a first metal contact disposed over said passivation layer and into said contact aperture making electrical contact with said n+ region; and a second metal contact making electrical contact with said n+ substrate.

2. The punch-through diode transient suppression device of claim 1 wherein:

said substrate and said n+ region have a peak dopant concentration of about 1.5E18 cm$^3$;

said p+ region has a peak dopant concentration of between about 50 to about 2,000 times said peak dopant concentration of said p- region; and said p- region has a dopant concentration of between about 0.5E14 cm$^3$ and about 1.0E17 cm$^3$.

3. The punch-through diode transient suppression device of claim 2 wherein:

said n+ region has a junction depth of greater than about 0.3 um;

said p+ region has a thickness of between about 0.3 um and about 2.0 um, and said p- region has a thickness of between about 0.5 um and about 5.0 um.

\* \* \* \* \*

UNITED STATES PATENT AND TRADEMARK OFFICE
CERTIFICATE OF CORRECTION

PATENT NO. : 5,880,511
DATED : March 9, 1999
INVENTOR(S) : Bin Yu, Chenming Hu, Ya-Chin King, Jeffrey T. Pohlman, and Rita Trivedi It is certified that error appears in the above-identified patent and that said Letters Patent is hereby corrected as shown below:

Title Page in the Inventor Information: please replace "Rita Trivedi, Corpus Christi," with --"Rita Trivedi, Corpus Christi, Texas--.

On column 2, line 7, please replace "1.5E18 cm$^3$" with --1.5E18 cm$^{-3}$--

On column 2, line 10, please replace "0.5E14 cm$^3$" with --0.5E14 cm$^{-3}$--

On column 2, line 11, please replace "1.0E17 cm$^3$" with --1.0E17 cm$^{-3}$--

On column 2, line 27, please replace "punch through" with --punch-through--

On column 3, line 42, please replace "1.5E18 cm-3" with --1.5E18 cm$^{-3}$--

On column 3, line 44 please replace "0.5E14 cm-3" with --0.5E14 cm$^{-3}$--

On column 3, line 44, please replace "1.0E17 cm-3" with --1.0E17 cm$^{-3}$--

UNITED STATES PATENT AND TRADEMARK OFFICE
CERTIFICATE OF CORRECTION

PATENT NO. : 5,880,511

DATED : March 9, 1999

INVENTOR(S) : Bin Yu, Chenming Hu, Ya-Chin King, Jeffrey T. Pohlman, and Rita Trivedi It is certified that error appears in the above-identified patent and that said Letters Patent is hereby corrected as shown below:

On column 4, line 11, please replace "1.0E17 $cm^3$" with --1.0E17 $cm^{-3}$--

On column 4, line 54, please replace "ohm/cm" with --ohm-cm--.

On column 5, line 12, please replace "ohm/cm" with --ohm-cm--.

On column 5, line 14, please replace "ohm/cm" with --ohm-cm--.

On column 6, line 43, please replace "ohm/cm" with --ohm-cm--.

On column 7, line 1, please replace "ohm/cm" with --ohm-cm--.

On column 7, line 3, please replace "ohm/cm" with --ohm-cm--.

On column 8, line 53, please replace "5E14 cm-2" with --1.5E18 $cm^{-2}$--

On column 8, line 63, please replace "2.0E19 $cm^3$" with --2.0E19 $cm^{-3}$--

On column 8, line 64, please replace "1.0E17 $cm^3$" with --1.0E17 $cm^{-3}$--

On column 8, line 65, please replace "1.8E15 $cm^3$" with --1.8E15 $cm^{-3}$--

On column 9, line 21, please replace "$cm^3$" with --$cm^{-3}$--

On column 9, line 27, please replace "$cm^3$" with --$cm^{-3}$--

UNITED STATES PATENT AND TRADEMARK OFFICE
CERTIFICATE OF CORRECTION

PATENT NO. : 5,880,511
DATED : March 9, 1999
INVENTOR(S) : Bin Yu, Chenming Hu, Ya-Chin King, Jeffrey T. Pohlman, and Rita Trivedi It is certified that error appears in the above-identified patent and that said Letters Patent is hereby corrected as shown below:

On column 9, line 34, please replace "$cm^3$" with --$cm^{-3}$--

On column 10, line 37, please replace both occurrences of "$cm^3$" with --$cm^{-3}$--

Signed and Sealed this

Fifteenth Day of February, 2000

Attest:

Q. TODD DICKINSON

*Attesting Officer*        *Commissioner of Patents and Trademarks*